United States Patent
Berco

(10) Patent No.: US 7,796,443 B2
(45) Date of Patent: Sep. 14, 2010

(54) METHOD OF ERASING A FLASH EEPROM MEMORY

(75) Inventor: Danny Berco, Hsin Chu County (TW)

(73) Assignee: FS Semiconductor Corp., Ltd., Hsinchu (TW)

( * ) Notice: Subject to any disclaimer, the term of this patent is extended or adjusted under 35 U.S.C. 154(b) by 262 days.

(21) Appl. No.: 12/137,937

(22) Filed: Jun. 12, 2008

(65) Prior Publication Data

US 2009/0310424 A1     Dec. 17, 2009

(51) Int. Cl.
*G11C 11/34* (2006.01)

(52) U.S. Cl. .............................. 365/185.29; 365/185.18

(58) Field of Classification Search ............ 365/185.29, 365/185.18, 185.33
See application file for complete search history.

(56) References Cited

U.S. PATENT DOCUMENTS

| | | | |
|---|---|---|---|
| 4,698,787 A | 10/1987 | Mukherjee et al. | |
| 5,077,691 A | 12/1991 | Haddad et al. | |
| 5,243,559 A | 9/1993 | Murai | |
| 5,361,235 A | 11/1994 | Kodama | |
| 5,457,652 A | 10/1995 | Brahmbhatt | |
| 5,790,460 A | 8/1998 | Chen et al. | |
| 6,236,608 B1 * | 5/2001 | Ratnam | 365/218 |
| 6,507,522 B2 * | 1/2003 | Lee et al. | 365/185.3 |
| 7,079,424 B1 * | 7/2006 | Lee et al. | 365/185.29 |
| 7,529,138 B2 * | 5/2009 | Park et al. | 365/185.29 |

* cited by examiner

*Primary Examiner*—Anh Phung
(74) *Attorney, Agent, or Firm*—Muncy, Geissler, Olds & Lowe, PLLC

(57) ABSTRACT

The invention is a new method for erasing a flash EEPROM memory device. The memory device has a first semiconductor region within a second semiconductor region, source and drain regions in the first semiconductor region, a well terminal inside the first semiconductor region, a charge storing layer electrically isolated from the first semiconductor region by a dielectric layer, and a control terminal electrically isolated from the charge storing layer by a inter layer dielectric. The method comprises the steps of: applying a first voltage bias of first polarity to the well terminal; allowing a first time period to elapse; applying a second voltage bias of second polarity opposite to the first polarity to the control terminal; resetting the first voltage bias to zero; allowing a second time period to elapse; and resetting the second voltage bias to zero.

20 Claims, 4 Drawing Sheets

METHOD OF ERASING A FLASH EEPROM MEMORY

BACKGROUND OF THE INVENTION (a) Field of the Invention

This invention relates to the operation of a non volatile flash memory cell and in particular to erasing the cell by manipulating the stored charge within.

(b) Description of the Related Art

A flash EEPROM cell is a semiconductor device having non volatile memory properties which can be electrically programmed and erased. The non volatile memory properties enable the device to retain stored information once the power is turned off. The information is in the form of electrons stored within the floating gate. Devices of this type are described in U.S. Pat. Nos. [1] 4,698,787 and [2] 5,077,691, all of which are incorporated herein by reference. Other similar devices of this type are also described in U.S. Pat. Nos. [3] 5,243,559, [4] 5,361,235, [5] 5,457,652 and [6] 5,790,460, all of which are incorporated herein by reference.

Flash EEPROM devices are electrically erasable, programmable, read-only memory devices, which are electrically programmed and erased using on chip high and negative voltage generation circuitry. Data is stored in a binary format in the cell in a manner that the cell is set to a programmed state and reset to an erased state. Programming the cell is accomplished by storing electrons in the floating gate usually by means of tunneling or hot carrier injection. Erasing the cell is done by removing the charge usually by means of tunneling.

In the prior art there are several erase techniques for a flash memory mostly based on the physical phenomena of charge tunneling through a potential barrier. Implementation of tunneling erase techniques requires the usage of large electrical field across the dielectric between the floating gate and the well. These high electrical fields are known to generate reliability issues that degrade the quality of the dielectric which would eventually cause device failure. As devices advance further into sub micron dimensions, the intensity of the electric fields grow higher to become a dominating factor limiting the device scale down process.

Conventional flash cell erase is achieved by application of a large negative voltage to the control gate and simultaneous application of a moderate positive voltage to the source region. This technique is usually referred to as Negative Gate Source Erase (NGSE). A variation to this method uses both source and drain regions in the erase process at the same time with the exact same bias operation methodology. FIG. 1 shows a prior art flash cell using Fowler-Nordheim tunneling for NGSE. The cell 9 is fabricated on a P-type substrate 10 which is maintained at ground potential, while a large negative potential Vg of about −11V is applied to the control gate 11 and simultaneously a positive potential Vs of about 5V is applied to the source region 12, fabricated from an n+ type semiconductor inside an n-region 15. The drain region 8 is kept floating throughout the process. The electrical field formed across the dielectric layer 19 between the floating gate and the substrate would yield a tunneling current draining the electrons stored in the floating gate.

This erase scheme suffers from a reliability issue caused by "hot hole" injection from the substrate 10 into the tunneling dielectric 19 [I-III]. Since the source region 16 is reversed biased during the erase operation, a band to band tunneling current is present at the surface 17. This tunneling current produces energetic holes that are attracted by the floating gate to source electric field and have a probability for tunneling into the floating gate. This probability is directly related to the magnitude of this electric field. Thus, the "hot hole" current has a strong dependency on the electric field and imposes yet another limit on device sizing as well as on operation voltage levels. The stronger the electric field the larger the tunneling current and vice versa. These "hot hole" cause damage to the semiconductor insulator interface 17 and the dielectric layer 19 by generating interface states and inter dielectric traps. Given enough time, these traps would line up to cause a breakdown of the insulator layer and rend the device useless, a phenomena known as Time Dependent Dielectric Breakdown (TDDB). TDDB theory presents an exponential dependency of the breakdown probability and time to failure of the device on the electrical field strength and stress duration. Attempting to prolong the time to failure by lowering the electric field would result in exponentially longer erase times since the Fowler-Nordheim tunneling current density has an inverse exponential dependency as well and would decrease with lower electric fields. Furthermore, by using NGSE the hot hole tunneling current is localized beneath the source and floating gate overlapping area and the likelihood of the dielectric traps to line up and form a breakthrough path is high.

Referring to FIG. 2, another prior art erase technique is presented using a p-type well structure 24. The p-well 24 is contacted using a p+ region 29 and formed in a deep n-type well 25. The n-well 25, which may be contacted using an n+ region 36, is formed within a p-type substrate 23. This erase technique uses a large negative bias potential Vg applied to the control gate 21 of about −11V while simultaneously applying a positive bias potential Vb of about 5V to the p-well 24 via the well terminal 29. The charge storing layer 28, also referred to as floating gate, lies beneath the control gate 21 with a dielectric 34 forming an intermediate insulating layer. Usually the p-type substrate 23 is grounded and the n-well 25 is kept floating during the erase operation. The source region 30 and the drain region 31 are either kept floating [3] or at the same potential as the p-well 24 [6], causing the electrons stored in the floating gate 28 to tunnel vertically through the tunneling oxide 33 and into the channel region 22. This prior art erase technique is commonly referred to as Negative Gate Channel Erase (NGCE).

The NGCE technique suffers from a different reliability problem. Since the charge is erased into the channel region 22, by using high electric fields a high energy, a tunneling electron could impact ionize the semiconductor interface to generate an electron hole pair. This energetic hole, as in the previously presented NGSE method, would be attracted by the same high electric field and tunnel back through the dielectric layer 34 into the floating gate 28. This "hot hole" tunneling current would have the same affect on the dielectric quality and cause degradation over time. However, since in this case, the surface states and inter dielectric traps are distributed along the entire channel length, most of the performance penalty would be manifested in cell read current degradation and reduced programming performance. The impact on programming efficiencies results from the fact that these traps interfere with the hot carrier injection process.

Another prior art variation for NGCE technique [6] utilized the same biasing potential application for the p-type well 24 and the source region 30. This technique attempts to minimize the reliability problems induced by hot hole injection by applying the same potential bias to the source and the well, thus minimizing the band to band tunneling the would otherwise occur at the source dielectric interface 26. This prior art technique, however, does not eliminate the need for using high electric field across the dielectric during erase and the resulting TDDB and performance degradation issues.

FIG. 3 shows the biasing voltage waveform time dependence used to operate the flash cell during erase in the prior art. All prior art techniques use an operation methodology that dictates a simultaneous application of the bias pulses for the control gate and the well either with or without the source and drain regions (the latter are either operated in the same manner as the well or kept floating). Since tunneling is the main mechanism used in erasing the cell it is necessary to generate a strong electrical field over the dielectric during erase. As a result, the potential difference between the control gate and the well should be the highest obtainable. The well bias waveform has a finite rise and fall times and a positive polarity while the control gate bias waveform simultaneously assumes a negative polarity. The effective erase time for tunneling to occur is the actual overlap time of these two waveforms when the electric field is maximized. All prior art techniques attempt to maximize the overlap time between these waveforms in order to get the maximal electrical field during the erase sequence making them highly vulnerable to the above mentioned reliability issues. Another drawback of this prior art operation methodology is that the biasing scheme would also yield an electric field across the control gate to floating gate dielectric that would induce charge tunneling from the former to the latter. This tunneling current would interfere with the erase process by adding charge to the floating gate.

When inter dielectric charge traps are present under the floating gate (as shown in FIG. 4 as 41b), the tunneling current from the floating gate to the well has two major components: the direct tunneling component (marked 37b as in FIG. 4) and the indirect tunneling component. The direct component is that of charge having sufficient energy to overcome the potential barrier and tunnel to the well, also commonly referred to as Fowler-Nordheim tunneling or "Field Emission". The indirect component or trap assisted tunneling comprises of two stages. The first stage being the tunneling of charge from the floating gate to the trap (marked 38b in FIG. 4) and the second being tunneling of the same charge from the trap to the well (marked 39b in FIG. 4). The tunneling mechanism is well known to be of a random nature and of having a probability function dependency given by $$J \propto \frac{P_{1(x_t)} \cdot P_{2(x_t)}}{P_{1(x_t)} + P_{2(x_t)}} \quad (1)$$

Where Xt indicate the trap location measured from the floating gate to dielectric interface, P1 is the tunneling probability of the first stage and P2 is the tunneling probability of the second stage. FIG. 8 shows the probability function dependence on trap location. Referring to FIG. 8, the two stage indirect tunneling current probability components P1, P2 and (P1+P2) as a function of a trap location within the dielectric is depicted. The probability P1 is the tunneling probability of the first stage, gate to trap, as a function of trap location and is of inverse exponential nature. The probability P2 is the tunneling probability of the second stage, trap to well, as a function of trap location and is of inverse exponential nature as well. Both components P1 and P2 display an inverse exponential behavior, where the probability for tunneling to occur decreases exponentially with the distance. The component (P1+P2) has local minima at the dielectric width mid point suggesting that traps located next to this location would have a larger contribution to the indirect tunneling current. The reasoning is that although traps located inside the dielectric near the floating gate (marked 40b in FIG. 4) have a higher tunneling probability P1 in the first stage, their second stage tunneling probability P2 is considerably lower and vice versa for traps located close to the well (marked 42b in FIG. 4). Since the overall tunneling probability is a multiplication of these two elements the smaller one would dominate the outcome.

Mobile positively charged ions within the dielectric are also known to degrade the performance of MOS structures by reacting to the gate voltage potential and having charge trapping and releasing properties [IV-V]. FIG. 7 shows how such positively charged mobile traps within the dielectric are displaced when a voltage potential is applied to the gate due to electric field rejection. Referring to FIG. 7, a structure 50 having a control gate 52 and an underlying dielectric layer 54 is depicted. The dielectric layer contains positively charged mobile traps (ions) 53. The movement of these traps due to positive bias 51 application to the gate is depicted using directional arrows. In the same manner, when a flash cell is operated according to prior art as described in FIG. 3, such traps would assume a fixed position in the dielectric during the erase process closer to the floating gate due to the negative bias on the control gates. In this new location the tunneling probability of the above mentioned indirect current component would be lower and as a result this component would decrease.

The background and associate prior art erase procedures are described in the following publications: [I] Witters, et al., "Degradation of Tunnel Oxide Floating Gate EPROM Devices and Correlation With High-Field-Current-Induced Degradation of Thin Gate Oxides", IEEE Transactions On Electron Devices, Vol. 36, No. 9, September 1989, p. 1663. [II] Chun, et al., "Lateral Distribution of Erase Induced Hole Trapping and Interface Traps in Flash EPROM NMOSFET Devices", IEEE Semiconductor Interface Specialists Conference, 1996. [III] A. Yokozawa, et al., "Investigation for Degradation of the Retention Characteristics due to Oxide Traps Induced by Hole Injection", NVMSW proc. 1998 pp. 83-85. [IV] S. G. Dmitriev, Y. V. Markin, "Macroscopic Ion Traps at the Silicon Oxide Interface", Semiconductor, Vol. 32, pp. 625-628, June 1988. [V] Vertoprakhov et al., "The effect of mobile charge in silicon dioxide on the surface states density of mos structure", Russian Physical Journal, Vol. 19, pp. 378-379.

BRIEF SUMMARY OF THE INVENTION

As a means to avoid the problems described in prior art erase techniques, a novel erase method for flash cells is presented. One object of an embodiment of the invention is to provide a method of erasing a flash electrically erasable, programmable, read-only memory device, which allows both the usage of lower levels of biasing voltages and of shorter biasing pulse durations thus inherently having a lower vulnerability to the electrical field stress induced reliability issues.

A flash memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer.

The erase method in the present invention comprising of the following steps:
(1) Application of a first voltage bias of one polarity to the well terminal and the second semiconductor region with the source and drain regions either kept floating or at the same voltage bias.
(2) After a time interval, resetting the first bias to zero and application of a second voltage bias of an opposite polarity to the control gate.

Thereby removing charge stored in the floating gate by means of tunneling through the dielectric layer and into the well and source and drain regions.

The erase method of the present invention introduces an innovative approach for the erase process by usage of mobile positively charged traps (ions) located within the dielectric layer and of surface state traps located at the well dielectric interface. These traps assist in the erase process by serving as an intermediate point for the tunneling process. By applying the first positive voltage to the well during the first stage, these traps would be forced to deplete from any stored charge within, while during the second stage, where the well bias is reset and the control gate is inversely biased, charge is removed from the floating gate by direct and indirect, trap assisted, tunneling currents. This indirect tunneling component enables the usage of shorter bias pulses since it increases the indirect tunneling current component.

Flash cell erase is performed to a specific threshold voltage which only depends on the amount of charge removed from the floating gate. Thus, the present invention would yield higher tunneling currents without having the inevitable merits of strong electric fields exposure that usually accompany prior art methods. The present invention utilizes an electric field that is about half in magnitude then the one used in all prior art techniques and that has a shorter duration which gives higher immunity to the prior art reliability issues, which in turn have an exponential dependency on both the electric field's magnitude and duration.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

Figure 4:
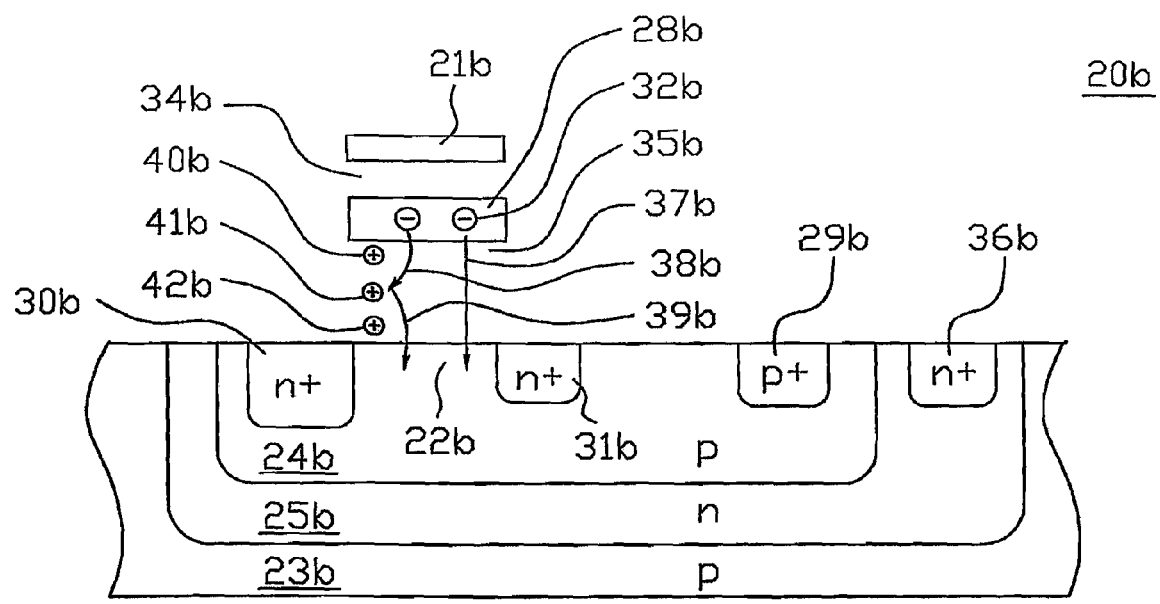
FIG. 4 is the same cross sectional view of FIG. 2 using corresponding reference numerals and showing the effect of erasing using the method presented in the present invention.

FIG. 4 shows an embodiment of the present invention using an n-type flash EEPROM. The EEPROM device 20b is formed in a p-type triple well 24b, formed within an n-type deep well 25b, formed in a p-type substrate 23b. The device has a control gate 21b that is formed above a floating gate 28b with an inter layer electrically isolating dielectric 34b. The floating gate 28b is isolated from the channel area 22b by a dielectric layer 35b as well. The floating gate 28b is used as a charge storing layer, and may be made of a localized charge trapping material such as nitride, a non localized charge storing material such as poly silicon, an electric charge conducting material, or an isolating material. The drain 31b is formed from an n-type semiconductor as is the source 30b. The triple well is contacted using highly doped p-type region 29b and the deep n-well is contacted using highly doped n-type region 36b.

Figure 5:
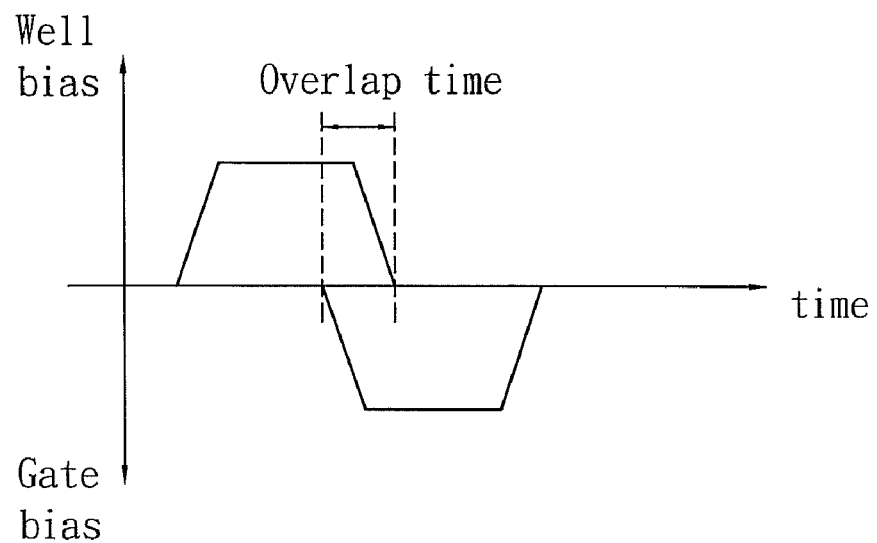
FIG. 5 depicts bias voltage waveform timing alignment used in the erase process in one configuration of the present invention.
Figure 6:
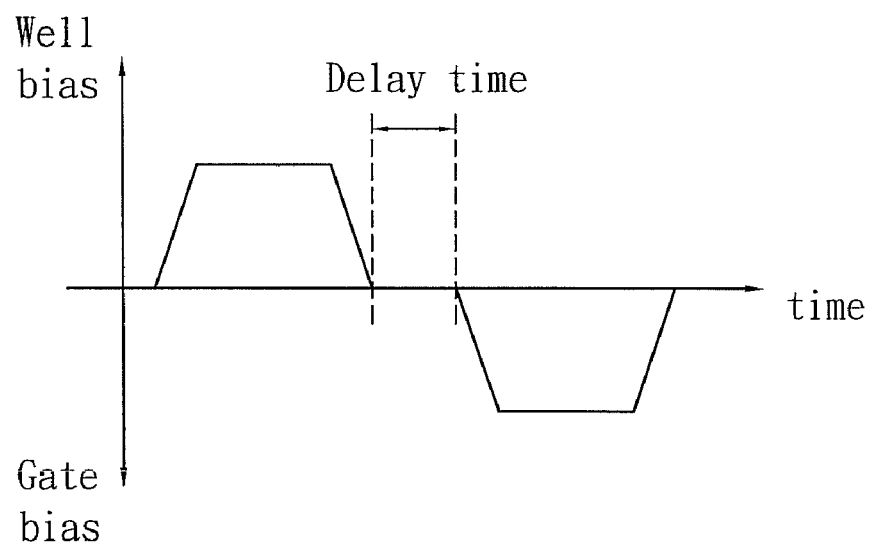
FIG. 6 depicts bias voltage waveform timing alignment used in the erase process in a second configuration of the present invention.
Figure 7:
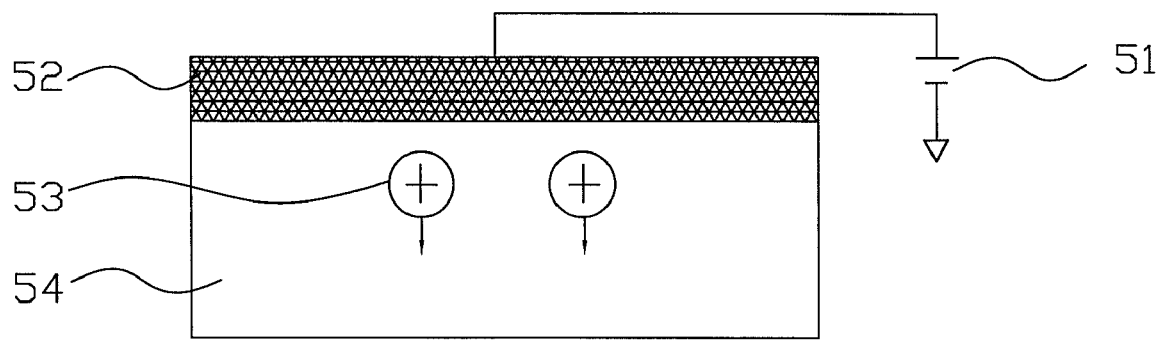
FIG. 7 depicts mobile charge traps in the dielectric relocation during application of a positive gate bias.
Figure 8:
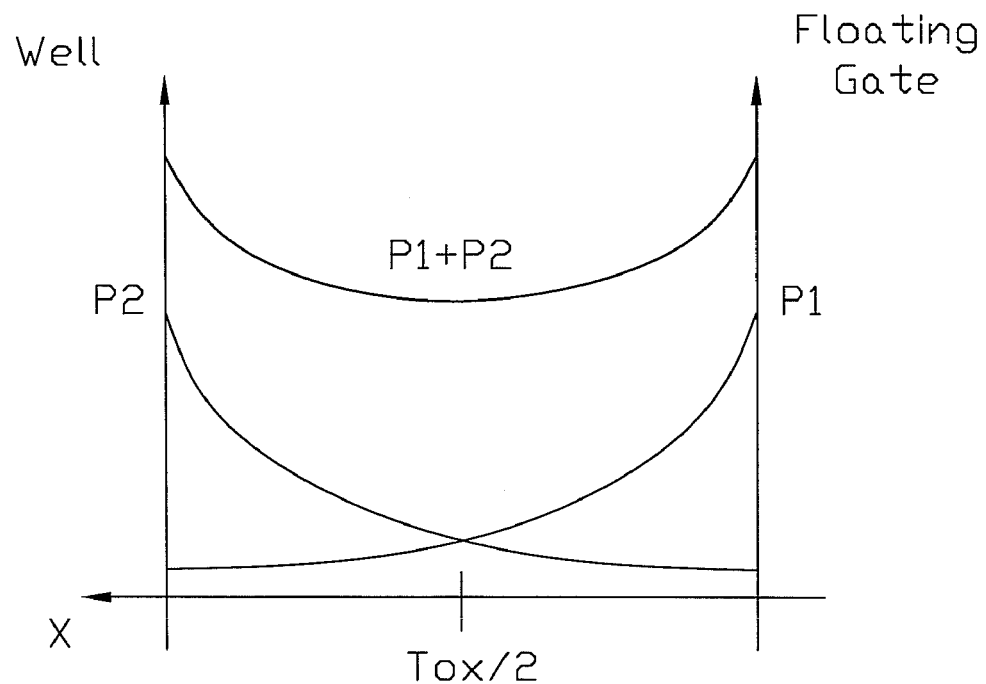
FIG. 8 depicts trap assisted tunneling probability as a function of trap location within the dielectric between the anode and cathode terminals.

In an embodiment of the present invention, erasing the flash cell is accomplished by biasing the well and gate terminals as described in FIG. 5 or FIG. 6 in two stages. Referring to FIG. 5, the biasing voltage waveform time dependence used to operate the flash cell during erase in a first manner of the current invention is depicted. The well biasing voltage is of a positive polarity and the gate biasing is of negative polarity. The well bias is triggered first and after a certain settling time period has elapsed the gate negative bias is triggered. The overlap time between the two pulses, which may or may not equal zero, is depicted as well. Referring to FIG. 6, the biasing voltage waveform time dependence used to operate the flash cell during erase in a second manner of the current invention is depicted. The well biasing voltage is of a positive polarity and the gate biasing is of negative polarity. The well bias is triggered first and after a certain settling time period has elapsed it is reset back to zero. After another delay time period has elapsed, which may or may not equal zero, the gate negative bias is triggered. The delay time between the two pulses is depicted as well.

In conclusion, the erase technique according to an embodiment of the present invention is accomplished by biasing the well and gate terminals in two stages. In the first stage a positive voltage is used to bias the triple well and in the second stage a negative voltage is used to bias the control gate. The two bias pulses may have an overlap time as indicated in FIG. 5 or a delay time as indicated in FIG. 6. Obviously, in an embodiment, a positive voltage may be used to simultaneously bias the triple well and source region in the first stage, and in another embodiment, a positive voltage may be used to simultaneously bias the triple well and the source and drain regions in the first stage.

Referring to FIG. 4, during the first erase stage, a positive voltage bias is applied to the triple p-type well 22b via the well terminal 29b. The deep n-type well 25b is kept floating while the p-type substrate 23b is generally grounded. The source 30b and drain 31b regions may be kept floating or biased using the same waveform as the triple well 22b. Once a certain time period has elapsed, the second stage is initiated during which a negative bias is applied to the control gate 21b and the well bias is reset back to zero. The erase sequence is finished when the control gate bias is reset back to zero.

Figure 1:
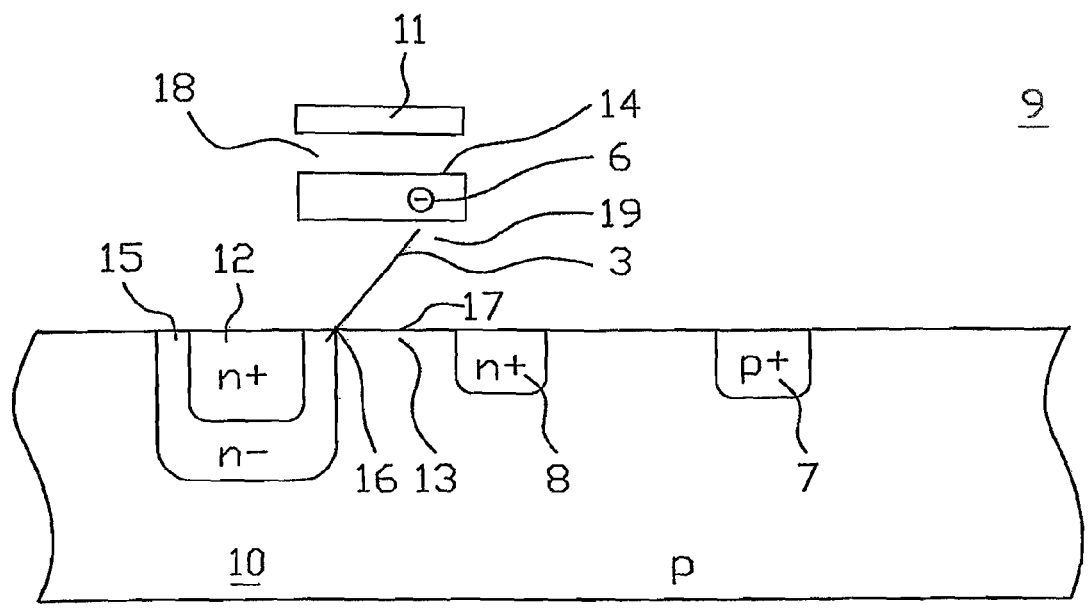
FIG. 1 is a cross sectional view of a flash EEPROM cell in the prior art operated with the NGSE method.
Figure 2:
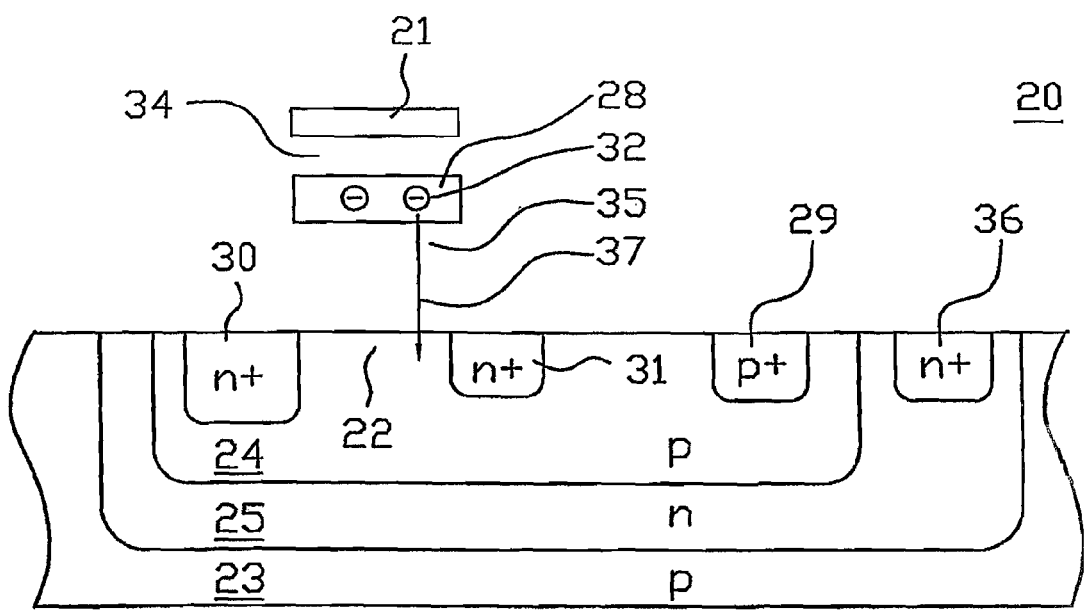
FIG. 2 is a cross sectional view of a flash EEPROM cell in the prior art operated with the NGCE method.
Figure 3:
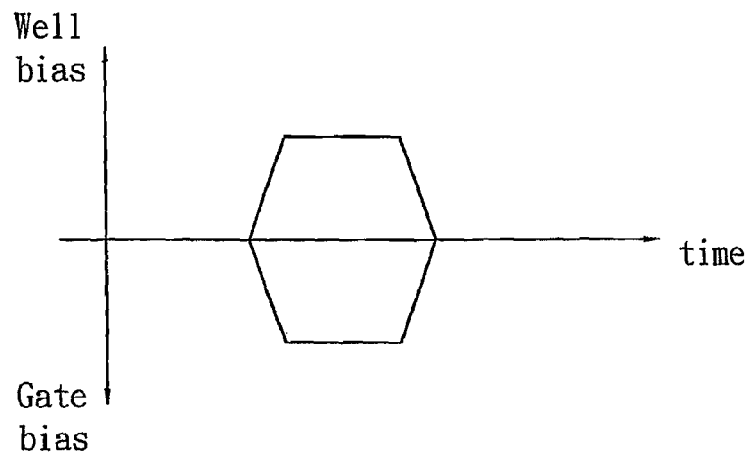
FIG. 3 depicts bias voltage waveform timing alignment used in all erase methods of prior art.

The well positive bias during the first stage would generate an electric field originating from the well surface to the floating gate 28b across the dielectric layer 35b and forcing the "surface state traps" (marked 32 in FIG. 2) and "inter dielectric traps" (marked 41b in FIG. 4) to release any stored charge within into the well. Furthermore, any inter dielectric mobile ions located near the well dielectric interface would be rejected by this positive electric field and relocate to a more favorable position closer to the dielectric mid point. The direct consequence is that the inter dielectric traps are setup to a tunneling assisting mode in which their probability to attract free charge from the floating gate increases. The time period needed for the traps to enter this state depends on their charge retention lifetime. Once the second stage is initiated, the control gate 21b is biased with a negative voltage which would generate an electric field across the floating gate 28b to inter layer electrically isolating dielectric 34b in an opposite direction from the one generated during the first stage. This field would trigger both a direct and indirect tunneling currents from the floating gate 28b to the well thus erasing the cell. A direct result of this operation methodology is that the electric fields formed over the dielectric interface is about half in magnitude of the ones used in all prior art techniques and shorter in duration as well. Both features mean higher immunity to the described reliability issues of the prior art, the latter having an exponential dependence on both the electric field's magnitude and duration. Using weaker electrical fields would considerably lower the tunneling from control gate 21b to floating gate 28b, a known factor to interfere with the erase process.

Erasing the cell to a predetermined threshold level depends only on the quantity of electrons removed from the floating gate 28b. The present invention describes not only a more efficient method for removing this charge, thus exposing the cell to shorter time periods of electrical field stress, but also allows the usage of weaker fields during erase since biasing is done in two consecutive stages. All prior art erasing techniques dictate the usage of simultaneous biasing schemes. These methodologies require stronger fields and longer erase times making them highly vulnerable to electrical stress induced reliability issues, in turn having an exponential dependence on both field strength and duration.

The above operational description is valid for any kind of EEPROM cell by using the same waveforms or reversing their polarity depending on the polarity of charge being manipulated and the type of semiconductor being used to implement the cell. Based on the above, those skilled in the art would realize that the embodiments of the present invention described herein are illustrative only and are not in any way limiting. Other embodiments of this invention will be obvious to those skilled in the art in view of this description.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:

applying a first voltage bias of first polarity to the well terminal;
allowing a first time period to elapse;
applying a second voltage bias of second polarity opposite to the first polarity to the control terminal;
resetting the first voltage bias to zero;
allowing a second time period to elapse; and
resetting the second voltage bias to zero.

2. The method of claim 1, wherein the first voltage bias is simultaneously applied to the source region and the well terminal.

3. The method of claim 1, wherein the first voltage bias is simultaneously applied to the source and drain regions and the well terminal.

4. The method of claim 1, wherein the charge storing layer is based on a localized charge trapping material, a non localized charge storing material, an electric charge conducting material or an isolating material.

5. The method of claim 1, wherein the first voltage bias is positive and the second voltage bias is negative.

6. The method of claim 1, wherein the first semiconductor region is p-type and the source and drain regions are n-type.

7. The method of claim 1, wherein the absolute value of the first voltage bias is smaller then the second voltage bias.

8. A method of erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:

applying a first voltage bias of first polarity to the well terminal;
    allowing a first time period to elapse;
    resetting the first voltage bias to zero;
    allowing a second time period to elapse;
    applying a second voltage bias of second polarity opposite to the first polarity to the control terminal;
    allowing a third time period to elapse; and
    resetting the second voltage bias to zero.

9. The method of claim 8, wherein the first voltage bias is simultaneously applied to the source region and the well terminal.

10. The method of claim 8, wherein the first voltage bias is simultaneously applied to the source and drain regions and the well terminal.

11. The method of claim 8, wherein the charge storing layer is based on a localized charge trapping material, a non localized charge storing material, an electric charge conducting material or an isolating material.

12. The method of claim 8, wherein the first voltage bias is positive and the second voltage bias is negative.

13. The method of claim 8, wherein the first semiconductor region is p-type and the source and drain regions are n-type.

14. The method of claim 8, wherein the absolute value of the first voltage bias is smaller then the second voltage bias.

15. A method of erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:

applying a first voltage bias of first polarity to the well terminal;
    allowing a first time period to elapse;
    resetting the first voltage bias to zero while simultaneously applying a second voltage bias of second polarity opposite to the first polarity to the control terminal;
    allowing a second time period to elapse; and
    resetting the second voltage bias to zero.

16. The method of claim 15, wherein the first voltage bias is simultaneously applied to the source region and the well terminal.

17. The method of claim 15, wherein the first voltage bias is simultaneously applied to the source and drain regions and the well terminal.

18. The method of claim 15, wherein the charge storing layer is based on a localized charge trapping material, a non localized charge storing material, an electric charge conducting material or an isolating material.

19. The method of claim 15, wherein the first semiconductor region is p-type and the source and drain regions are n-type.

20. The method of claim 15, wherein the first voltage bias is positive and the second voltage bias is negative.

\* \* \* \* \*